(12) United States Patent
MacKenzie et al.

(10) Patent No.: US 9,761,824 B2
(45) Date of Patent: Sep. 12, 2017

(54) MULTILAYER LIGHT-EMITTING ELECTROCHEMICAL CELL DEVICE STRUCTURES

(71) Applicant: Sumitomo Chemical Company Limited, Tokyo (JP)

(72) Inventors: John Devin MacKenzie, Lafayette, CA (US); Jian Ping Chen, Irvine, CA (US)

(73) Assignee: Sumitomo Chemical Company Limited, Tokyo (JP)

( * ) Notice: Subject to any disclaimer, the term of this patent is extended or adjusted under 35 U.S.C. 154(b) by 0 days.

(21) Appl. No.: 14/402,042

(22) PCT Filed: May 20, 2013

(86) PCT No.: PCT/US2013/041908
§ 371 (c)(1),
(2) Date: Nov. 18, 2014

(87) PCT Pub. No.: WO2013/173845
PCT Pub. Date: Nov. 21, 2013

(65) Prior Publication Data
US 2015/0123096 A1    May 7, 2015

Related U.S. Application Data

(60) Provisional application No. 61/649,076, filed on May 18, 2012.

(51) Int. Cl.
*H01L 51/52* (2006.01)
*H01L 51/50* (2006.01)

(52) U.S. Cl.
CPC ...... *H01L 51/5203* (2013.01); *H01L 51/5012* (2013.01); *H01L 51/5032* (2013.01)

(58) Field of Classification Search
CPC .................................................. H01L 51/5032
See application file for complete search history.

(56) References Cited

U.S. PATENT DOCUMENTS 5,682,043 A   10/1997  Pei et al.
7,868,537 B2   1/2011  Meijer et al.
(Continued)

FOREIGN PATENT DOCUMENTS

WO    WO 96/37001 A1    11/1996
WO    WO 97/40648       10/1997
(Continued)

OTHER PUBLICATIONS

PCT/US2013/041908, Sep. 18, 2013, International Search Report and Written Opinion.
(Continued)

*Primary Examiner* — Fernando L Toledo
*Assistant Examiner* — Valerie N Newton
(74) *Attorney, Agent, or Firm* — Wolf, Greenfield & Sacks, P.C.

(57) ABSTRACT

Novel structures and compositions for multilayer light-emitting electrochemical cell devices are described, particularly those that are adapted to work with stable and printable electrode metals, that optimize recombination efficiency, lifetime and turn-on kinetics. In particular, embodiments of the present invention provide improved performance and extended lifetime for doped electronic devices, where ionic doping levels, ionic support materials content, and electronic transport content are advantageously structured within the device. The doping profile of mobile or semi-mobile ionic dopants is intentionally made to be non-uniform to enhance doping in the interface regions of a device where the active layer interfaces with the electrode.

20 Claims, 9 Drawing Sheets

(56) References Cited

U.S. PATENT DOCUMENTS

| | | | |
|---|---|---|---|
| 8,207,519 B2* | 6/2012 | Nickel | H01L 45/085 257/4 |
| 2006/0046082 A1 | 3/2006 | Kumazawa et al. | |
| 2007/0074316 A1 | 3/2007 | Alden et al. | |
| 2007/0281386 A1 | 12/2007 | Park | |
| 2008/0265752 A1 | 10/2008 | Meijer et al. | |
| 2009/0272946 A1 | 11/2009 | Lu | |
| 2011/0057151 A1 | 3/2011 | Chen et al. | |
| 2012/0019161 A1 | 1/2012 | Edman et al. | |
| 2014/0197398 A1* | 7/2014 | MacKenzie | H01L 51/5088 257/40 |

FOREIGN PATENT DOCUMENTS

| | | |
|---|---|---|
| WO | WO 2006/077509 | 7/2006 |
| WO | WO 2006/077514 | 7/2006 |
| WO | WO 2007/137933 | 12/2007 |
| WO | WO 2011/110275 A2 | 9/2011 |

OTHER PUBLICATIONS

PCT/US2013/041908, Nov. 27, 2014, International Preliminary Report on Patentability.

Lee et al., High-efficiency polymer light-emitting devices using organic salts: A multilayer structure to improve light-emitting electrochemical cells. Appl. Phys. Lett. Jul. 8, 2002; 81(2): 214-6. doi: 10.1063/1.1490635.

Lee et al., Ionic Materials to Improve Charge Injections in Polymer Electroluminescent Devices. Organic Photonic Materials and Devices V. Proc. SPIE. Jul. 7, 2003; 4991: 144-51. doi: 10.1117/12.485817.

International Search Report and Written Opinion for PCT/US2013/041908 mailed Sep. 18, 2013.

International Preliminary Report on Patentability for PCT/US2013/041908 mailed Nov. 27, 2014.

U.S. Appl. No. 14/232,995, filed Mar. 26, 2014, MacKenzie et al.

PCT/US2012/049397, Oct. 29, 2012, International Search Report and Written Opinion.

PCT/US2012/049397, Feb. 13, 2014, International Preliminary Report on Patentability.

International Preliminary Report on Patentability for PCT/US2012/049397 mailed Feb. 13, 2014.

International Search Report and Written Opinion for PCT/US2012/049397 mailed Oct. 29, 2012.

Kim et al., "Surface Conditioning of Indium-tin Oxide Anodes for Organic Light-Emitting Diodes", Thin Solid Films, vol. 445, (2003), pp. 358-366.

Kirchmeyer et al., "Scientific Importance, Properties, and Growing Applications of Poly(3,4-Ethylenedioxythiophene)", J. Mater, Chem, 2005, vol. 15, pp. 2077-2088.

Kugler et al., Polymer Band Alignment At the Interface With Indium Tin Oxide: Consequences for Light Emitting Devices. Chem Phys Lett. 1999; 310(5-6):391-6.

Schlaf et al., "Work Function Measurements on Indium Tin Oxide Films", J. Elect. Spec. and Rel. Phen., vol. 120, 2001, pp. 149-154.

Wang et al., Display Device With Dual Emissive and Reflective Modes. Applied Physics Letters. 2005, 87 (11), 113502.

* cited by examiner

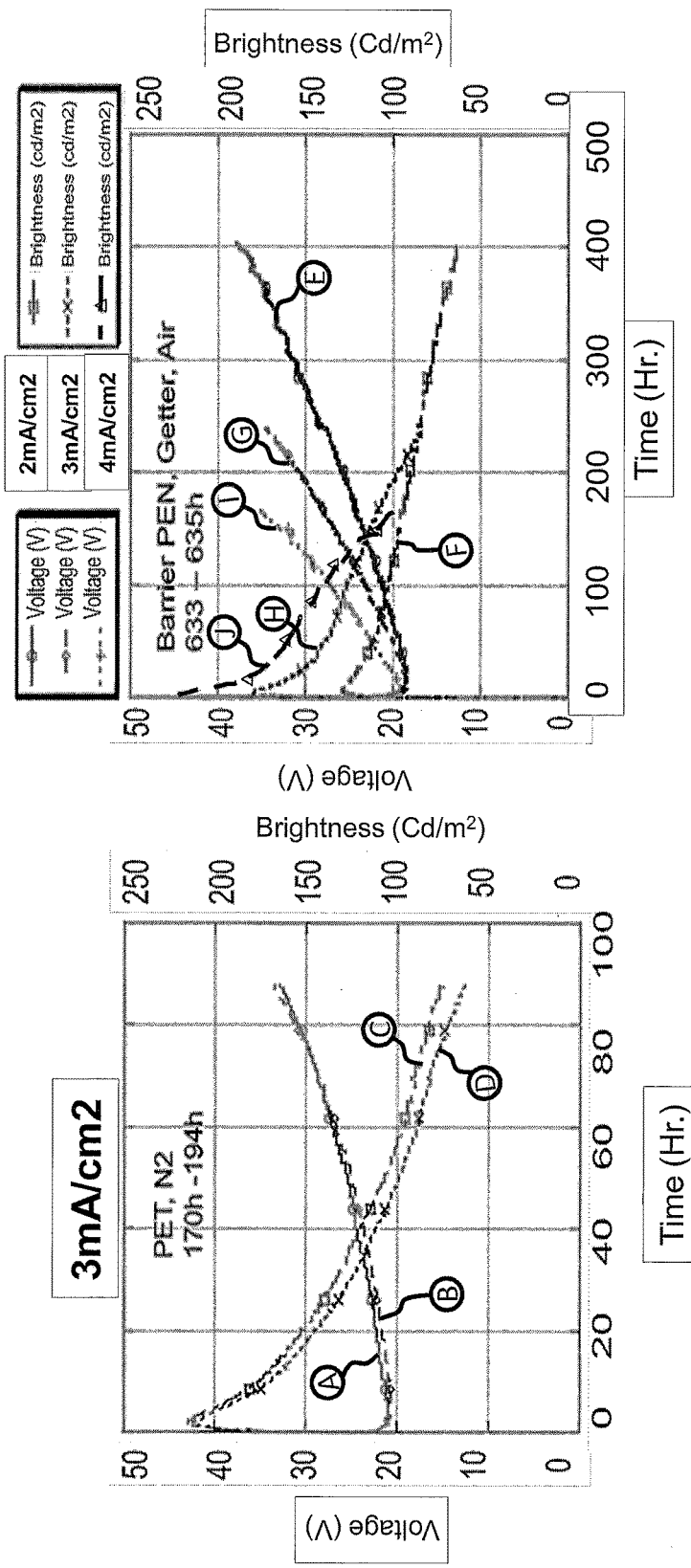

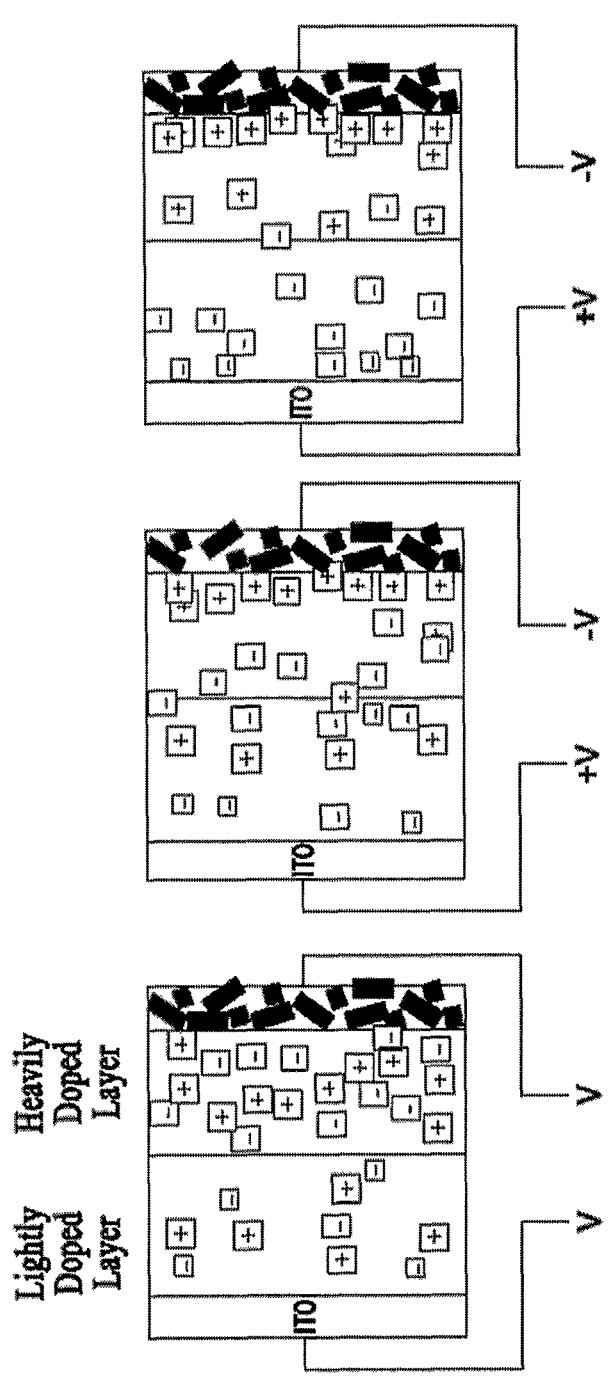

End EL

Initial EL

MULTILAYER LIGHT-EMITTING ELECTROCHEMICAL CELL DEVICE STRUCTURES

CROSS-REFERENCE TO RELATED APPLICATION

The present application is a national stage filing under 35 U.S.C. §371 of international PCT application, PCT/US2013/041908, filed May 20, 2013, which claims priority to U.S. Provisional Application Ser. No. 61/649,076, filed May 18, 2012, the entirety of which are incorporated herein by reference.

FIELD OF THE INVENTION

This invention relates to novel structures and compositions for multilayer light-emitting electrochemical cell devices.

BACKGROUND

Several types of organic light emitting electrochemical cells (OLECs) that have homogenous active layer compositions are known in the art. OLECs provide stable, low cost organic light emitting devices requiring low operating voltage. In their typical form, OLECs, such as those described in U.S. Pat. No. 5,682,043, are deposited from a single solution containing light emitting and charge transporting conjugated polymers, for example polyphenylene vinylene polymers, polythiophene-based polymers or polyfluorene-based polymers, in combination with an electrolyte system which typically includes mobile ionic dopants, for example lithium triflate along with electrolyte forming materials such as polyethylene oxide or similar. Low voltage charge injection in these devices, and relatively high quantum efficiency under bias, are generally attributed to the electric field driven redistribution of cation and ions from the electrolyte at the cathode and anode interfaces of the OLEC with its adjacent electrode. Ionic dopant redistribution serves to electrochemically dope the conjugated semiconductor active layer materials near the interface, leading to strong band bending and narrowing of the stateless injection barrier between electrons in filled states in the conductive electrode and corresponding unfilled molecular energy levels in the active layer semiconductors. This effectively lowers the bias required to inject electrons and holes into the active layer, leading to lower voltage electroluminescence when significant and relatively balanced electron and hole currents recombine at luminescent sites in the active layer.

In contrast to conventional organic light emitting diodes (such as devices shown in U.S. Pat. No. 4,539,507), which rely on near ohmic matching of the work function of the electrodes and the energy levels within the active layers of the device, and are often composed of multiple layers of organic semiconductor-based materials with different energy levels, the conventional OLEC has the advantage that charge injection at low bias can be achieved from metals of less well-matched work function, than is required by a conventional OLED. Essentially all previous LEC devices have been based on a single light-emitting polymer, even where some structuring of doping has been considered. Examples can be found in U.S. Pat. No. 6,326,091.

It is particularly advantageous to eliminate the need for low work function cathode materials in OLECs at the electron-injecting interface. Low work function cathode metals such as Ca, Li, Cs, Ba, and Mg, which are commonly used in conventional approaches, including polymer OLEDs (such as devices shown in U.S. Pat. No. 5,247,190), are typically unstable to oxidation or other degradation mechanisms, particularly in the presence of moisture or oxygen. This constrains the processing environments for devices containing these materials. These low work function metals also have higher encapsulation requirements and/or shorter storage lifetimes as water or oxygen leakage into the device leads to spontaneous cathode degradation. Further references can be found in U.S. Pat. No. 6,522,067.

Recently, significant attention has been given to printing- and coating-based approaches for the fabrication of semiconductor thin film and, in particular, organic semiconductor thin films devices. These printing and coating-based manufacturing approaches permit lower cost, higher volume production of device over larger areas and on flexible substrates. The doping concept is particularly attractive for manufacturing light emitting organic devices as it permits the use of printable, air stable, and air processable cathode materials (for example U.S. Pat. No. 6,605,483). However, high levels of doping can reduce luminance efficiency due to doping-induced quenching of luminescence. Also, side reactions of dopants, which are exacerbated at high concentrations, can lead to accelerated degradation of device performance. Generally speaking, it may be more difficult to inject one charge type than the other in a given active layer medium. Often, as is the case for the combination of alkoxy substituted PPVs such as 'Super Yellow' (SY) as sold by Merck OLED GMBH, it is electron injection that is more difficult to achieve than hole injection, particularly when higher work function and more air stable cathodes are used. This has also been observed in polyfluorene-based LECs.

In addition to low cost processing of single active layer devices (i.e. excluding conducting polymer hole injection layers) with homogenous, as deposited compositions, such as those described in U.S. Pat. No. 5,682,043 and U.S. Pat. No. 6,605,483, printing also allows for the easy deposition of multilayered active layer structures. Light-emitting electrochemical cells (LECs) can be printed with good optoelectronic performance at thicknesses ranging from ~150 nm to over 1 micron. This total thickness can be built up by a number of successive print passes. The present inventors have recognised that this printing approach provides an opportunity to vary composition between printed layer passes including variations in light emitters, charge transport, and ionic dopant functionality through the thickness of the device. By using different inks for different printed layers, stratified devices can be produced. In some cases, drying of printing solvent between layer depositions may be effective in preventing redissolution of underlying layers that would otherwise degrade the desired vertical composition profile. In other cases, cross-linking agents, the use of active materials or additive materials with orthogonal solubility in solvents used for deposition of successive layers may also be used to limit inter-layer solubility.

In U.S. Pat. No. 6,326,091, Schoo et al., propose a type of multilayer structure built solely around a mobile and immobile ion concept in which there are only mobile or immobile ions for one of the charge types. We have found, as in U.S. patent application Ser. No. 12/557,316 to Chen, et al. that mixtures of ion mobilities and properties are advantageous. Furthermore, U.S. Pat. No. 6,326,091 specifies ionic mobility and compositions outside the ranges applicable in the present invention. For example, U.S. Pat. No. 6,326,091 specifies ionic mobilities for the immobile ion as being higher than 1e-19 cm2/Vs. For devices of interest to this invention, ranging from 100 nm to 500 nm in thickness and at operating voltages preferably below 24V and more preferably near or below 10V typical operating conditions, the lowest immobile ion mobility would be ~5e-17 and more likely >1e-15 cm2/vs. This assumes that useful biasing cycles would be <24 hr and more likely <1 hr. In this case, the acceptable minimum mobility required here is actually similar to the 'mobile' ion of U.S. Pat. No. 6,326,091. In addition, U.S. Pat. No. 6,326,091 specifies that the second layer of the multilayer contain mobile ions and immobile ions in equal amounts. This is a specification that is not required in the present invention.

Multilayer device structures, first investigated in Merck Super Yellow (SY) based printed light-emitting electrochemical cell (LEC) devices, have been shown to be very effective in increasing lifetimes, efficiencies and in some cases turn-on times in printed devices derived from screen printing and gravure printing. In particular, they have been particularly effective in improving polyfluorene Light-Emitting Polymer (LEP)-based devices where there has been the additional factor of allowing the use of LEP's with varying electronic energy levels and charge transport levels that would not otherwise be printable due to poor print morphology and yield issues. The polyfluorene series of materials also allowed the more advanced multilayer configurations, which include stepwise variation of transport properties in the devices stack, which was not possible in the simple Super Yellow (SY) LEP case. Although fabricating multilayers introduces complexity due to the need for a second LEP ink, this is not a significant burden in manufacturing as devices are typically printed in several layers with both screen or gravure printing, even if they contain a single LEP formulation throughout the device.

Simple doping multilayers where neutral, compensated within each layer as deposited, dopant concentrations are peaked near the cathode interface can significantly improve device performance. However, further improved results occur when doping gradients are also combined with electronic transport gradients through the thickness of the devices. Multilayer printed LEC devices based on Sumation light-emitting polymers with air printed cathodes exceeding 14,000 hours lifetime (100 Cd/m2) have been demonstrated in this way and represent the longest lifetime printed LEC devices known to the inventors. Advantageous structuring of ionic dopant, ionic support materials and semiconducting polymer content can also result in improved turn-on kinetics of OLECs. Note that ion-motion related slow turn-on effects are a limitation in some conventional OLECs.

Overall, the multilayer work with SY and polyfluorene-based LEP materials supports the general conclusion that devices are cathode injection limited to some degree. In all cases, heavier doping of the near cathode region, even with a common LEP, results in improved devices. All recent multilayer device work incorporates higher doping levels in the near-cathode layers unless otherwise specified. The objective of the present disclosure is to teach device active layer structures with special properties at the regions adjacent to an electrode. In the following text, specific reference nomenclature has been used sporadically to refer to certain device structures/materials. For example, the code 'SWL' indicates a specific type of white light emitting polymer. Persons skilled in the art will easily understand that this specific nomenclature is for illustrative purposes only, and the scope of the present invention is not limited to the specific device structures/materials denoted by the nomenclature.

Examples of early work in polyfluorene-based multilayers which showed an almost 3× improvement in lifetime and approximately a 50% improvement in external quantum efficiency (EQE) is shown in FIGS. 1A-1D. LEP006 was an early polyfluorene-based LEP derivative with interesting performance levels compared to other candidates available at the time. However, the film morphology was poor. LEP011 used a different backbone monomer, which resulted in significantly improved print quality but poorer voltage performance. The hole transport monomer fractions were similar in these two LEPs. It is possible that the improvement in device performance in this case was related to the improved cathode layer LEP morphology and/or the differences in electronic properties also caused by the LEP011 monomer change that gave advantageous charger transport and/or blocking effects at the LEP006/LEP011 interface.

Lifetime test studies compared blended LEP006+LEP011 all printed device in N2 test environment (FIG. 1A) with devices with getter and in air (FIG. 1B). Lifetimes ranged from <200 h for non-gettered devices to ~635 hrs for gettered devices. This performance was similar to the single LEP (LEP006 only) level of performance. However, multilayer structures of LEP011 and LEP006 had lifetimes of ~1000 hrs and 2000 hrs for N2 tested, ungettered devices and air-tested gettered devices, respectively. In FIGS. 1A-1D, the LEPs are described as vendor-specific codes SWL006 and SWL011. Curves A and B in FIG. 1A show voltage-vs-time curves, while curves C and D show brightness-vs-time curves at a current density of 3 mA/cm$^2$. FIG. 1B shows voltage-vs-time curves E, G and I at current densities 2 mA/cm$^2$, 3 mA/cm$^2$ and 4 mA/cm$^2$ respectively. FIG. 1B also shows brightness-vs-time curves F, H and J at current densities 2 mA/cm$^2$, 3 mA/cm$^2$ and 4 mA/cm$^2$ respectively. Multilayer structures of LEP011 and LEP006 had lifetimes of ~1000 hrs and 2000 hrs for N2 tested, ungettered devices and air-tested gettered devices, respectively. FIG. 1C shows voltage-vs-time curves K and M at current densities 3 mA/cm$^2$, and 2 mA/cm$^2$ respectively for a specific device (without getter). FIG. 1C also shows brightness-vs-time curves L and N at current densities 3 mA/cm$^2$, and 2 mA/cm$^2$ respectively. For gettered devices, FIG. 1D shows voltage-vs-time curves P and R at current densities 2 mA/cm$^2$, and 3 mA/cm$^2$ respectively. FIG. 1D also shows brightness-vs-time curves Q and S at current densities 2 mA/cm$^2$, and 3 mA/cm$^2$ respectively.

SUMMARY OF THE INVENTION

Embodiments of this invention describe novel structures and compositions for multilayer light-emitting electrochemical cell devices, particularly those adapted to work with stable and printable electrode metals, that optimize recombination efficiency, lifetime and turn-on kinetics. In particular, embodiments of the present invention provide improved performance and extended lifetime for doped electronic devices, where ionic doping levels, ionic support materials content, and electronic transport content are advantageously structured within the device.

In this invention, the doping profile of mobile or semi-mobile ionic dopants is intentionally made to be non-uniform to enhance doping in the near interface regions of a device. Special properties of the active layer of an electronic device adjacent to an electrode work to the advantage of overall efficiency and enhanced performance of the device.

In one embodiment, high doping levels in the electrode-adjacent regions lead to lower voltage charge injection at the interface and overall higher device efficiencies. In turn, these lower voltages and higher efficiencies lead to long effective device lifetimes. Of particular interest is the cathode region. Furthermore, the dopant concentration may be intentionally lower in non electrode-adjacent regions of the active layer such that dopant-related quenching is minimized and recombination efficiency is maximized. This is different from conventional OLEC approaches which assume a homogenous active layer composition prior to application of bias. This doping profile variation can optionally be associated with a variation in the light emitting and charge transporting content of the layers.

In one aspect of the invention, an electronic device is disclosed, the device including an active layer in between a first electrode and a second electrode, wherein a higher concentration of neutral ionic dopant pairs is present in a region of the active layer adjacent to the first electrode as compared to the rest of the active layer.

In another aspect, an electronic device is disclosed with a printed electrode and an active layer, wherein a paste to print the electrode has finite solubility of injection enhancing dopants, and, wherein, a higher concentration of dopants is present in an electrode interface region of the active layer of the device which is to be adjacent to the electrode, such that loss of dopant into the electrode paste during electrode fabrication is compensated.

In yet another aspect, an electronic device with a printed electrode and a semiconductor active layer is disclosed, wherein a film to print the electrode has finite solubility of injection enhancing dopants, and, wherein, a higher concentration of dopants is present in an electrode interface region of the semiconductor active layer of the device which is to be adjacent to the electrode, such that loss of dopant into the electrode firm during electrode fabrication is compensated.

In a further aspect, a device structure is disclosed with a film at an interface of a semiconductor active layer and an electrode, wherein a region of the semiconductor active layer immediately adjacent to the electrode contains a smaller amount of electrolyte supporting side chains or electrolyte-supporting polymer and a higher average density of states available for charge carrier injection than a region that is farther from the interface.

Persons skilled in the art will appreciate that though in many of the examples a printable cathode has been described as the 'top' electrode, i.e. an electrode on top of an active layer, the scope of the invention is not limited by device orientation. For example, the "top" electrode can be a cathode or an anode. In other words, a cathode is not necessarily on the "top" of the active layer. It can be in the bottom as well depending of device configuration (top-emitting or bottom-emitting).

BRIEF DESCRIPTION OF THE DRAWINGS

These and other aspects and features of the present invention will become apparent to those ordinarily skilled in the art upon review of the following description of specific embodiments of the invention in conjunction with the accompanying figures, which describe various implementation examples of embodiments of the invention in a service accessed by a browser application on any known or future computing device. Those skilled in the art will understand how to implement the invention after being taught by the foregoing descriptions and drawings.

FIGS. 1A-1D show lifetime test data from polyfluorene-based printed OLEC devices.

FIGS. 5A-5C schematically illustrate a multilayer device with a highly doped (2× doped) region near cathode, assuming equal diffusivities for all ions, according to embodiments of the present invention.

DETAILED DESCRIPTION OF EXAMPLE EMBODIMENTS

Figures 1C, 1D:
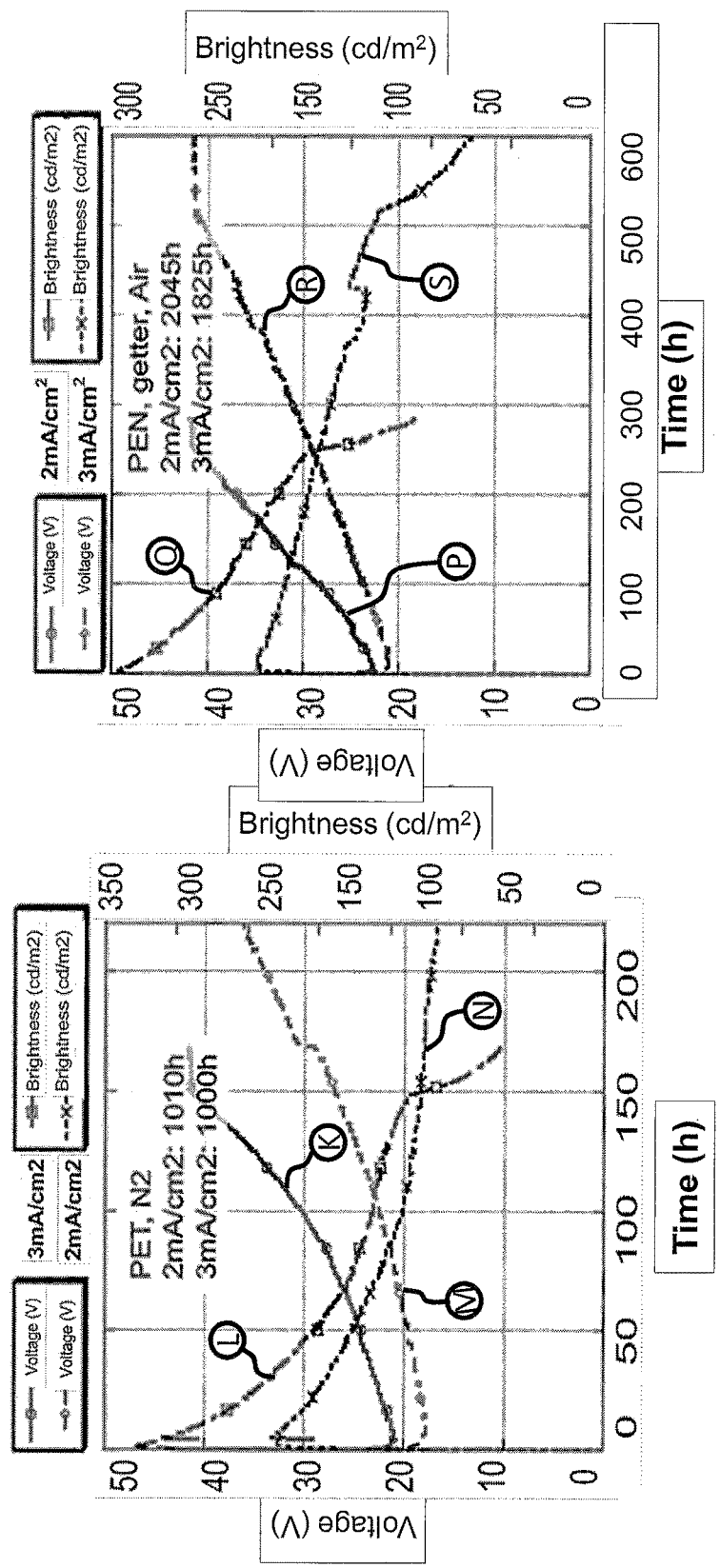

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

It is advantageous to have a high concentration of electron transporting materials near the cathode, a low concentration of hole transporting functional material near the cathode; a high concentration of emitter materials near the recombination zone; a high amount of hole transporting material adjacent to the anode, and a low amount of electron transport near the anode. In some devices, where the charge imbalance is a rate limiting step for a given materials system, and the added complexity of depositing a large number of layers is problematic, it may be optimal to focus only on two function region types (for example, electron injection and transport near the cathode as a first zone and maximized recombination efficiency as a second zone). This also pertains to the doping profile where in a relatively complex embodiment of this concept, there is a heavily doped cathode adjacent zone, a relatively low doping level recombination zone, and a third heavily doped anode zone. A simpler structure might include heavy doping only near the cathode zone and a reduced doping elsewhere in the device. This has been found to be effective with LEC devices based on Super Yellow, ITO (Indium Tin Oxide) anodes with no HIL layer, and printed Ag cathodes.

Furthermore, in LECs or doped OLEDs with a printed cathode, high doping near the cathode interface can have further useful effects. Generally speaking, electrolyte and ionic dopants may be soluble in the liquid ink used for deposition of a printed cathode on top of the topmost cathode-facing layer. This is particularly true in the case where a cathode ink is formulated such that it does not significantly dissolve the typically apolar light emitting polymer of the active layer which it overlays. This implies a more polar or hydrogen bonding nature solvent for the cathode ink, which, in turn, has a greater likelihood of being a solvent for the ionic dopants or other electrolyte components. During the deposition process when liquid cathode ink is in contact with the underlying layer, ionic dopants and other electrolyte components (e.g. polyethylene oxide, ethylene oxide copolymers and surfactants), dopants and electrolyte components may leach out of the near cathode interface and be diluted into the cathode ink. This may cause an undesirable depletion of dopants, such as cation-containing species or other electron injection-enhancing agents, which are needed for low voltage injection of electrons at this interface. This can also partly explain, in addition to contact area effects, why higher voltages are generally observed for printed cathodes on devices versus evaporated cathodes of the same metal where the evaporated cathode contains negligible non-metallic components or voids as compared to the printed cathode.

Figure 2:
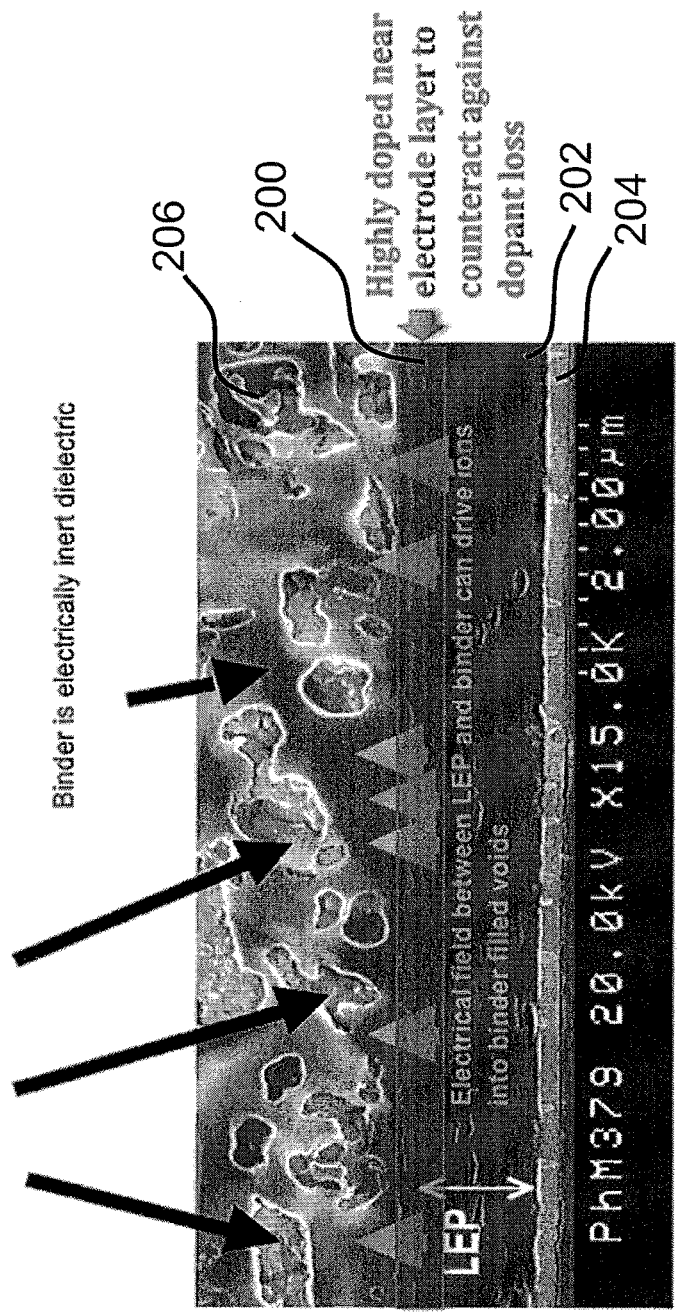
FIG. 2 shows a micrograph of cross section of a device showing a highly doped region near the electrode layer to counteract against dopant loss, according to an embodiment of the present invention.

By forming a multilayer structure with a higher, as deposited dopant or electrolyte concentration at the top surface on which the cathode will later be printed, an improved situation can be achieved, independent of the relative mobilities of the dopant ions or dopant ion combinations. This high concentration of dopants or electrolyte provides for a situation where, even if there is loss of dopant or electrolyte into the cathode during deposition, a high enough concentration of dopant still remains such that facile electron injection is still maintained. Dopant loss can also occur after the cathode is formed through dopant diffusion or drift during thermal treatment of the OLED/cathode combination, Dopant loss, particularly cationic dopant loss, may also occur during forward bias device operation wherein dopants may drift under applied field into non-metallic regions of the cathode such as voids or binder-containing regions of the cathode such as would be expected from a low temperature deposited cathode from particle or organometallic precursor-derived cathodes, including functionalized nanoparticles, where significant voids or non-metallic volume fraction may remain after the device is formed. Dopants drawn into non-semiconductor regions in the cathode are rendered inactive and the lower concentration of dopants left behind in the near cathode region of the active layers of the device can reduce desirable charge injection rates under applied voltage. FIG. 2 shows the proposed, more heavily doped near-electrode interface region 200 superimposed on an actual electron micrograph of a layered, printed OLED device including a printed, metallic and organic composite cathode 206. Note that this concept can also be adapted to cases where the top interface of the device prior to printing an electrode is the anode or hole injection interface. In this case, it is the preservation of high concentrations of anionic species and hole transport enhancing materials which is of interest. As shown in FIG. 2, the LEP layer (202) is in between the bottom electrode 204 and top electrode 206. The top electrode has silver flakes with near-constant or constant potential, and are at various orientations relative to the LEP interface, such that the contact with the LEP interface is only at certain points. The top electrode also includes an electrically inert dielectric as binder. The electrical field between the LEP and the binder can drive ions into binder filled voids. Dopant loss is counteracted by the highly doped interface layer 200 near the top electrode.

Ionic dopants may also be soluble in the dried cathode film such as when the cathode film is a composite film including metallic components and a secondary organic component such as an inert binder polymer or other material which may have a significant solubility for ion dopants. This solubility in the cathode can drive diffusion of species out of the regions of the active layer near the cathode during deposition, during post-deposition thermal processing, and/or during storage or device use.

Generally speaking, the typical device construction here includes a substrate, which may be flexible plastic and contain barrier layers; a transparent anode layer, such as indium tin oxide from 50-200 nm in thickness; an active layer which includes charge transport and luminescent functionalities and this active layer is formed by a number of sublayers of varying composition; and a cathode layer such as that formed from a printed, evaporated or laminated metal such as Ag, Au or Al.

A further aspect of this invention is the use of ionic dopants with anions and cations of different drift mobilities. More specifically, in an electron injection enhanced device, that is a device where doping levels are higher near the cathode than in more internal active layer regions, it is also advantageous to choose the dopants such that they contain relatively immobile cations and more mobile anions. It may be further advantageous for each layer to contain a mixture of ion mobilities and sizes. It may be further advantageous for there to be a bias such that a majority of the cations near the cathode may be less mobile cations or that a majority of the anions near the anode may be less mobile than other anions in that region.

Under forward bias operation, negative biasing of the cathode tends to drive away anions towards the anode interface, leaving some locally uncompensated cations to dope the cathode region. Further cation motion is not required or reduced as the cations in the electron injection-enhanced device are already in position, and at a high enough concentration to facilitate electron injection. This can lead to faster turn-on kinetics, which can be a fundamental problem for LEC devices where turn on times of a second or less than one second are desirable, and the dependence on long ionic transport times are not appropriate. Note that turn-on times for the devices specified in U.S. Pat. No. 6,326,091 are too long to be of interest for many applications. Based on the current invention, devices of substantially faster turn on time have been demonstrated. Using relatively immobile cations prevents further cation motion towards the edge of the cathode interface which may lead to the above-mentioned cation loss into the cathode, overdoping, reductions in cathode performance and cathode metal interface instability. The use of highly mobile anions leads, upon application of bias, to rapid activation of a larger concentration of cations near the cathode, this then leads to rapid reduction of device impedance, rapid onset of injected electron currents, and rapid onset of luminescence. Note that luminescence onset can be a limitation for OLECs. For devices of interest to this patent, ranging from 100 nm to 500 nm in thickness and at operating voltages preferably below 24V and more preferably near or below 10V typical operating conditions, the lowest immobile ion mobility would be ~5e-17 and more likely >1e-15 cm2/vs. This assumes that useful biasing cycles would be <24 hr and more likely <1 hr. In the most desirable case for many applications which require immediate turn-on after indefinite relaxation periods, much higher mobilities are requires. Example calculations estimating these mobilities are included in Table 2 in this document.

Less mobile cations of interest include tetrahexyl ammonium cations from hexafluorophosphate (as compared to tetrabutyl ammonium) cations which have relatively large sidechains that impede drift. Other cations include those containing longer alkyl chains or phenyl groups such as tribenzyl-n-octylammonium cations in tribenzyl-n-octylammonium hexafluorophosphate.

In an embodiment of the invention, an active device sublayer with a low level of dopant is printed at the anode ('bottom' of the device for a typical bottom emitting, bottom facing anode device), and a sublayer with a higher level of doping printed to form the topmost regions of the active layer stack. In a further variant of this embodiment, the anode-adjacent sublayer contains a relatively immobile anion and a more mobile cation. In an additional further variant of this embodiment, the cathode-adjacent sublayer contains a relatively immobile cation and a more mobile anion. In this embodiment, it is intended that recombination occurs in the anode adjacent layer where doping levels are lower while the high cathode doping leads to improved and quicker onset electron injection. In some cases, electron injection at the cathode is a more significant rate limiting step than hole injection at the anode. This is in part due to relatively small barriers between transparent conductive anode materials, such as stable indium tin oxide or stable conducting polymer, and the highest occupied molecular orbital (HOMO) of organic semiconductors as compared to the bigger steps between cathode metals and the lowest unoccupied molecular orbitals (LUMOs).

In another embodiment of the invention, an active device sublayer with a high level of dopant is printed at the anode ('bottom' of the device for a typical bottom emitting, bottom facing anode device), a sublayer with a lower level of dopant is printed at the middle of the device and a sublayer with a higher level of doping printed to form the topmost regions of the active layer stack. In a further variant of this embodiment, the anode-adjacent sublayer contains a relatively immobile anion and a more mobile cation. Trifluoromethanesulfonylimide anion is an example, relatively slow moving anion (TFSI). In an additional further variant of this embodiment, the cathode-adjacent sublayer contains a relatively immobile cation and a more mobile anion.

In some cases where device thickness, charge transport, and ionic transport rates allow, it may be advantageous for the recombination zone of the device and/or the anode adjacent regions of the device to be completely undoped. In some cases this might also include reducing or eliminating any electrolyte matrix polymers Or additives in these regions (for example polyethylene oxide (PEO), polypropylene oxide (PPO), and copolymers containing these or similar materials). This would serve the function of increasing the density of electronic charge transporting function or recombination function in those regions as the amount of displacing, non-semiconducting electrolyte matrix is lower. It also reduces photoluminescent quenching related to ionic and doping of the active materials.

Varying the electrolyte former levels may also provide a means to control ionic transport and help to maintain and advantageous doping profile. For example, in the case of an electron injection limited device where the near cathode region has been more heavily doped, having a larger fraction of ionic transporting matrix material in the near cathode region may increase doping levels (via being able to support a higher amount of dissolved dopant, for example). Furthermore, having a lower level of or different ionic transporting matrix material near the recombination zone or the rest of the device can further control ion motion.

Figure 3A:
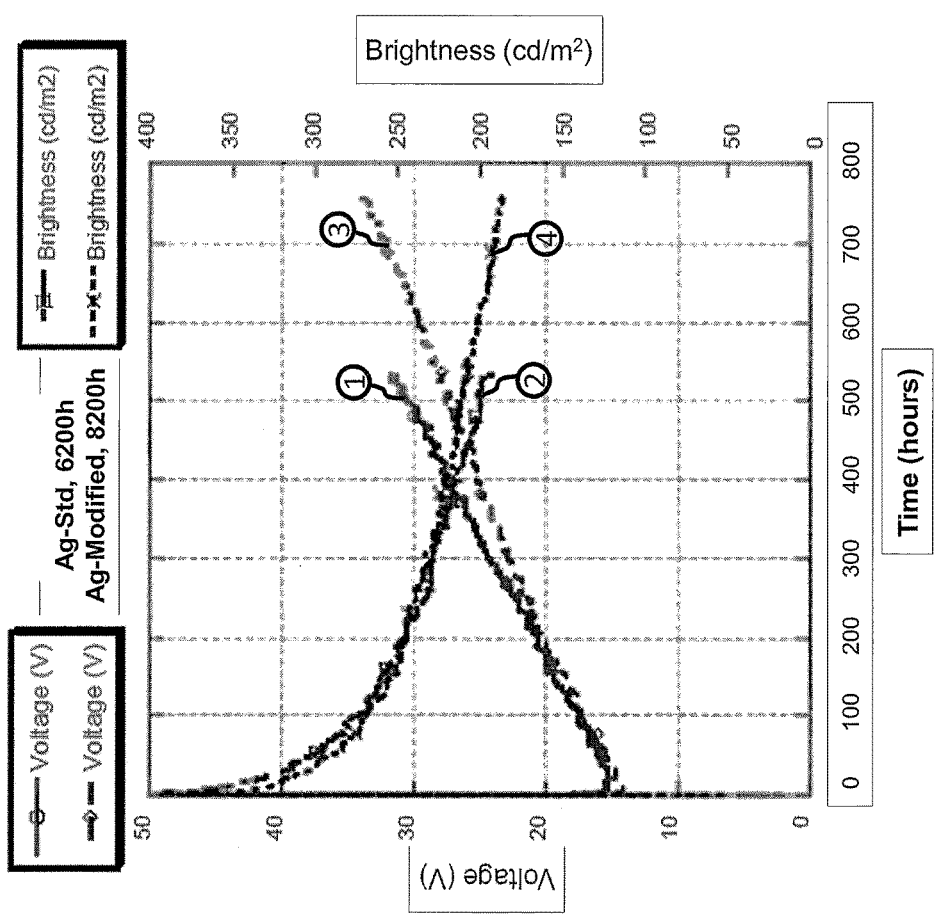
FIG. 3A shows lifetime test data for a screen-printed multi-layer device with getter material and encapsulation, and, FIG. 3B shows lifetime test data for a screen-printed multi-layer device with no getter material and no encapsulation, according to embodiments of the present invention.
Figure 3B:
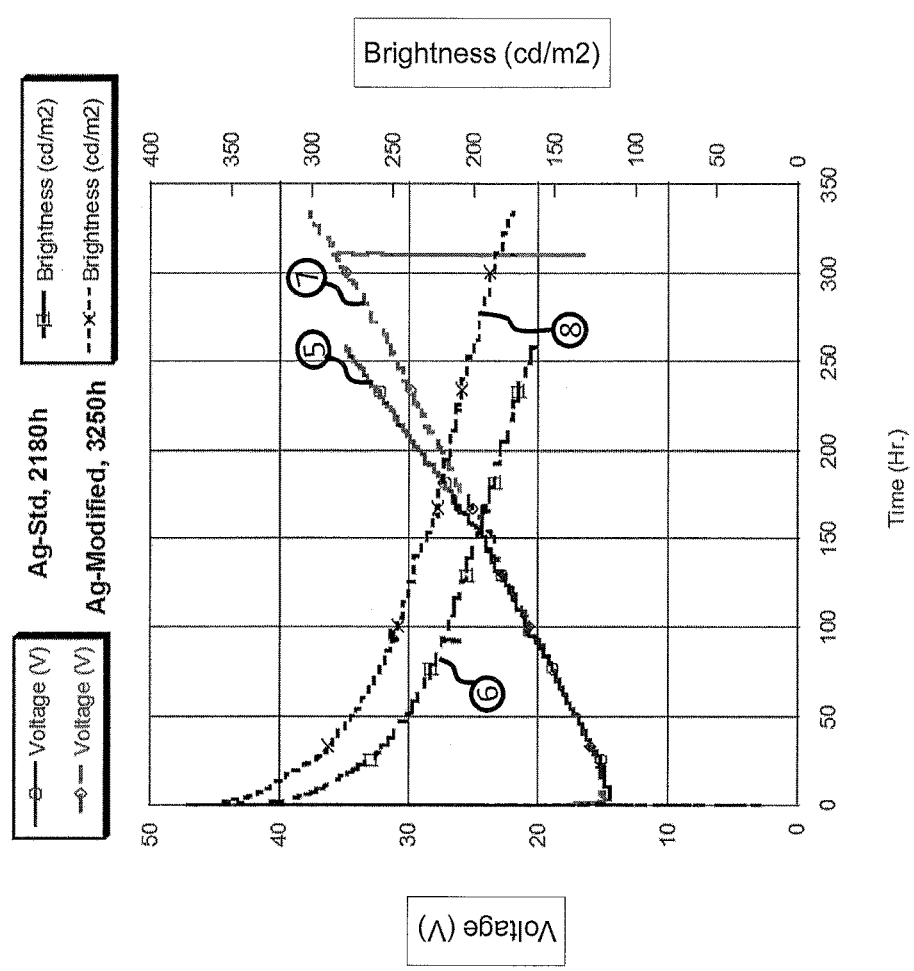

It can be further advantageous to combine the varying doping profiles in this patent with varying organic semiconductor energetics and structure. Examples of useful variations in structure include increased electrolyte function (ionic salt solubility or complexing close to the conjugated pi system of the semiconductor) of active semiconductor material sidechains, such that doping is enhanced in a near electrode layer to improve injection and transport while sidechains may be modified so that doping in electrode non-adjacent regions takes place at a higher rate due to less quenching of luminescent recombination due to ionic dopant effects near the luminescent centers. Further advantageous combinations include the combinations of heavily doped, electrode-adjacent doping profiles along with increases in electron transport functionality (such as a high fraction of fluorene moieties or a reduction in hole transport favoring moieties) in the near cathode region. This has been demonstrated repeatedly with LEP materials with differing hole transport molecular fractions where lower hole transport-content polyfluorene LEP-based materials were used in layers adjacent to the cathode. An example is given for LEP020/LEP006 multilayers in FIG. 3. In FIG. 3A, the gettered-encapsulated lifetimes for screen-printed ITO/LEP020-1/LEP006-8/Ag (Ag-M) mutlilayers are shown, where LEP006 has better electron transporting properties (due to its low HT content and higher PF content) and LEP021 has higher hole mobility due to its high HT unit content (designated as HT level 6). In FIG. 3B, the non-gettered, unencapsulated lifetimes are shown for similar devices, which ranged from 2180 h to 3250 hours, depending on cathode. LEP006-only devices typically had a few hundred hours in lifetime. For standard-silver (Ag) electrode formulation, the voltage-vs-time curve for the gettered device is curve number 1, and the brightness-vs-time curve is curve number 2. For the same device, but using a modified improved electrode formulation, the voltage-vs-time curve for the gettered device is curve number 3, and the brightness-vs-time curve is curve number 4. Similarly, for the ungettered device in FIG. 3B, curves 5 and 6 are voltage-vs-time and brightness-vs-time curves for standard Ag-formulation of the electrode, and curves 7 and 8 are voltage-vs-time and brightness-vs-time curves for modified Ag-formulation of the electrode.

Various electrolyte configurations have also been combined with that approach including the omission of PEO in the anode-adjacent layers. This can extend lifetime and improve efficiency in some cases. However, turn-on times are typically very poor due to the lack of ion transport.

Table 1 lists some relevant properties of Polyfluorene-based LEP materials that can be used for the active layer of the device embodiments in the current disclosure.

TABLE 1

LEP properties

| SWL | Mw | HT Level | $T_g$ | HOMO/LUMO |
|---|---|---|---|---|
| SWL006-8 | 1500K | HT1 | 197 C. | 5.04 eV 2.04 eV |
| SWL021-1 | 731K | HT6 | 228 C. | |
| SWL022-1 | 933K | HT3 | 188 C. | |

The complement to high electron transport near the cathode is high hole transport on the anode side. It may also be advantageous to combine the doping profiles in this invention with higher hole transporting composition levels (for example with a high level of phenyl amine type conjugated moieties) near the anode. These variations in charge transporting character in the near electrode regions can serve to enhance charge transport for the dominant carrier in their regions (holes near the anode and electrons near the cathode). The variants in active semiconductor composition can also serve to provide charge carrier blocking effects. For example, they can produce hole blocking near the cathode and electron blocking near the anode to increase quantum efficiency and reduce leakage currents. It may also be advantageous that the density of recombination centers, those that may trap and lead to recombination or have a high recombination rate, be reduced in the higher doping areas such that quenching of trapped excited states at recombination centers is less likely to occur in these heavily doped regions where the primary function is charge injection and transport. Generally speaking, correctly chosen multilayer LEP combinations has resulted in substantial increases in EQE suggesting better electron-hole balance which can be due to charge blocking and transport balancing. Furthermore, it may be advantageous to vary the composition of the active semiconductor materials so that there is a relatively high concentration of recombination centers or chromophores in the less heavily ion-doped regions of the device.

Figures 4A, 4B, 4C:
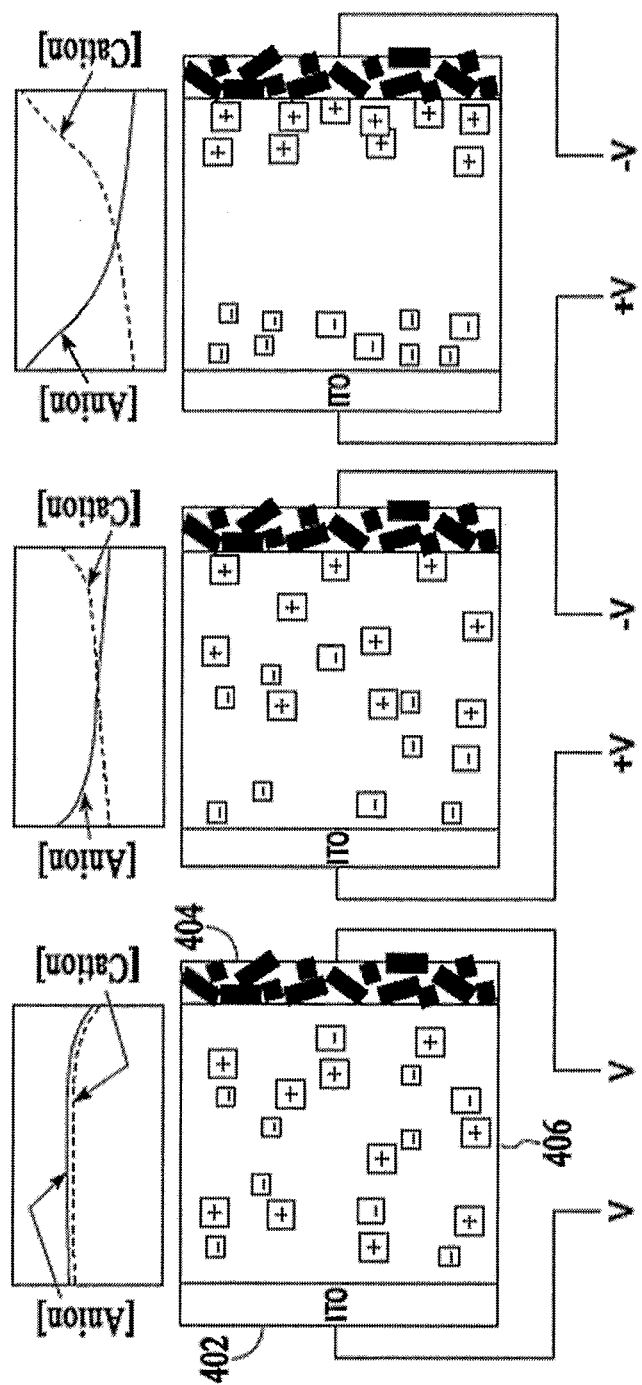
FIGS. 4A-4C schematically illustrate ionic doping over device lifetime at different stages, according to embodiments of the present invention.

FIGS. 4A-4C show dopant concentration (the graphs in the top row) and ion distributions (the device schematics in the bottom row) for the case of a uniformly, mobile ion-doped light emitting device (LEC-type) with equal anion and cation mobilities at different points of time, as discussed further below. In this homogeneous doping situation, equal diffusivity of all ions is assumed. In the device schematics, one electrode is shown to be smooth ITO (element 402), and the other electrode 404 is shown to be granular or particulate. However, persons skilled in the art will understand that the specific material, properties, and configuration of the electrode can be modified within the scope of this invention to suit a desired situation. The light emitting material 406 between the two electrodes has the positive and negative ions.

FIGS. 4A-4C show the expected progress of the dopant distributions over time. Specifically, the three cases from left to right are: before bias (FIG. 4A), initially after bias (FIG. 4B), and after significant time under bias (FIG. 4C). Reduction in doping near the cathode is noted due to leaching of dopant into the cathode.

FIGS. 5A-5C illustrate ion distributions for the case of a device with an active layer with a higher doping concentration layer adjacent to the cathode and a lower doping concentration layer near the anode, with equal anion and cation mobilities showing the expected progress of the dopant distributions over time. In one embodiment, the heavily doped layer adjacent to the anode may be twice as heavily doped compared to the relatively lightly doped layer adjacent to the cathode. There may be multiple (two or more) discrete layers between the cathode and the anode, each having their own doping concentration level. Graded concentration difference is possible too. Specifically in FIG. 5, the three cases from left to right are: before bias (FIG. 5A), initially after bias (FIG. 5B), and after significant time under bias (FIG. 5C). Note that the device is initially charge neutral with respect to ions prior to biasing. As in the case of FIGS. 4A-4C, equal diffusivity of all ions is assumed.

FIGS. 4A-4C pertains to a 'typical' single LEP ink composition PLED with printed cathode, where PLED is doped with proprietary material, for example compositions commercially made available by a company formerly known as Add-Vision, Inc. (AVI), based in Scotts Valley, Calif. While in the beginning a charge-neutral semi-homogeneous distribution of anions and cations are assumed, it is possible that some electrolyte may leach into cathode during cathode deposition and processing (FIG. 4A). Ion motion under bias moves cations to the cathode and the anions to the anode. Charge injection builds as ion-assisted tunneling rate rises from the electrodes into the LEP (FIG. 4B). As ion drift continues, ion concentration in the interior of the device drops which may increase radiative efficiency.

FIGS. 5A-5C show the progression of ions under bias for a doped active multilayer device in which different doping levels are introduced into subsequent active layers in the device, such as by printing. This technique can result, in the early stages of device bias, in a relatively high cation doping concentration near the cathode as compared to a homogenously doped device (as in FIGS. 4A-4C). This has some advantage over homogenously doped cathode injection-limited devices. However, this device configuration is limited by the fact that the anion and cation concentrations within the device are equal, which is non-optimal for the typical device which is intrinsically balanced in terms of electron and hole injection. This leads to higher than optimal concentrations of unnecessary counter ions within the active semiconducting layers of the device which can lead to quenching, overdoping and performance loss.

Note that there is a significant distinction between existing LEP multilayer structures, (e.g., LEP/+hole injection layer structures) and the dopant injection layers in the present application in that it is important that the ion donor layers in the embodiments of the present invention are significantly conductive. As stated previously, it is important that the dopant injection layer is conductive in that metallic conductors have an essentially zero electrical field within the bulk of the layer (in a finite carrier concentration metal including a conducting polymer, there would be some thin area of non-zero electric field) and are maintained at a particular bias. This serves to retain either cations or anions in this layer (anions in the cases of a cation-injecting dopant donor layer) while driving the counterion into the adjacent active layers. Note that this immobilization is independent of structure-induced ion mobility. The position of the electric-field retained ions in the conductive (anions, in the doped anode layer examples here) would be relatively constant over device lifetime which is different from a non-conductor with a finite electric field which would tend to drive high concentration ion drift over lifetime to the anode interface, which could be an additional source of degradation and voltage rise due to overdoping and screening effects. In the case of conducting, ion supporting donor layers, ions being driven into this layer from the active layer of the device would become immobilized and have limited impact, possibly causing some small increase in the already high charge carrier concentration in the metallic donor layer. These kind of devices often lead to earlier onset of e-injection and higher electron injection and higher electron/hole ratio compared to the homogeneously doped device of FIGS. 4A-4B.

Figure 6:
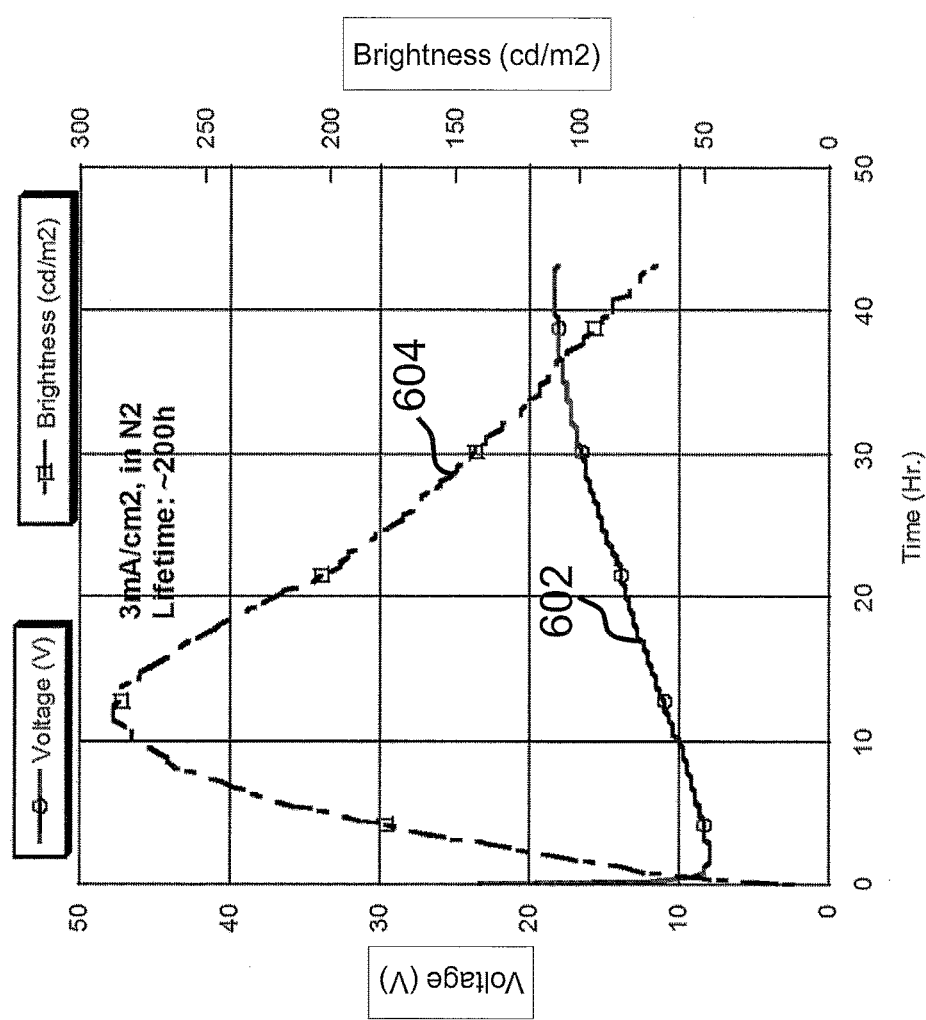
FIG. 6 shows slow turn-on time of conventional devices upon which the present invention is an improvement.

FIG. 6 shows very slow turn-on with a non-PEO (poly ethylene oxide—an ion transport supporting polymer additive included in may LEC formulations) containing an active layer structure with 400 nm LEP (among the thinnest LEP devices yielded—thin devices favor rapid turn-on due to short ion transit distances and higher electric fields for the same bias). The data in the figure shows the turn-on times, in this case in excess of 10 hours to reach peak luminance under constant current driving at 3 mA/cm$^2$) typical for insufficiently supported LEC electrolyte devices (as in the device in U.S. Pat. No. 6,326,091 which also have impractical turn-on times). Turn on times of interest for most applications of practical interest in lighting and displays are of order of seconds or less. The curve 604 shows the brightness-vs-time curve, and curve 602 shows the voltage-vs-time curve at a current density of 3 mA/cm$^2$.

Figure 7B:
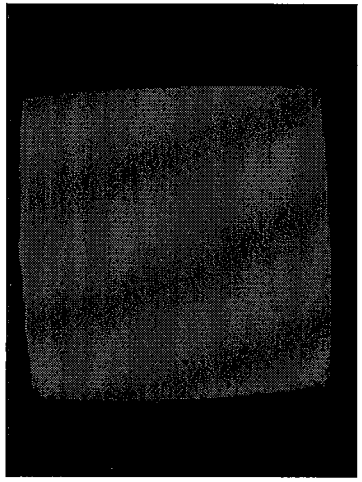
FIGS. 7A-7B show EL images of a device before and after turn on, according to embodiments of the present invention.
Figure 7A:

FIGS. 7A-7B compares electroluminescence (EL) pictures of the same device before and after turn-on. FIG. 7A shows a dark device barring a few specks, and FIG. 7B shows a bright device after turn-on.

Some of the embodiments of the present invention may be implemented as follows.

Devices in which a higher concentration of neutral ionic dopant pairs is present in a region near one of the electrodes as compared to an internal region of the device. For example, where the more heavily doped layer is near the cathode and the cation of the initially neutral pair is less mobile than the anion, or where the more heavily doped layer contains a combination of more mobile and less mobile ions of the same charge type. An example of the less mobile ion is a tetraalkyl ammonium ion, and an example of the more mobile ion is an asymmetrically functionalized ion.

In some implementations, devices with a printed cathode are disclosed, where the cathode ink has finite solubility of injection enhancing dopants and a higher concentration of dopants is present in the near cathode region of the active layer of the device prior to cathode deposition, such that loss of dopant into the cathode ink during fabrication is compensated by the higher, as deposited, dopant concentration in the near cathode-region of the active layer of the device. In such devices, the doping level in the near electrode region are preferably at least twice that of the lowest doped internal region in the device.

Further, devices are disclosed in which a higher concentration of ion supporting (electrolyte forming material) is present in a region near one of the electrodes as compared to an internal region of the device. The electrolyte former may contain ethylene oxide or propylene oxide, as examples.

In certain devices, the active layer polymers near the electrode interfaces may contain a higher concentration of ionic supporting sidechains than is present in interior regions of the active layer of the device. The ionic supporting sidechains may, for example, include oxygen in alkoxy or ethoxy form.

Yet further, devices with a printed cathode are disclosed in which the cathode film, after deposition, has finite solubility of injection enhancing dopants and a higher concentration of dopants is present in the near cathode region of the active layer of the device prior to cathode deposition.

A higher concentration of neutral ionic dopant pairs may be present in a region in a device near one of the electrodes as compared to an internal region of the device and the electron affinity of the active layer semiconductor is higher near the electron injecting electrode and/or the ionization potential is lower near the hole injecting electrode.

Such devices may be formed by depositing two or more layers by solution deposition of at least two inks, where the inks each include an electroluminescent polymer, a dopant, and a solvent, and where the dopant concentrations of the inks differ.

In the multilayer LEC type device of the present invention, the near electrode injection and transport enhancing layer contains a high concentration of injection enhancing dopant ion (e.g. cations for cathode adjacent layers) and it is not intended for these ions, which are the primary actors in this invention, to be mobile or move into another layer of the device. Furthermore, it is the goal of this invention to provide a layered structure with a significantly higher doping level in the enhancement layer than would be present in the active layer adjacent to the enhancement layer. We do not seek a corresponding or compensating relationship between the enhancement layer dopant ions and the dopant ion levels in adjacent active layer and in fact, it is one of the goals of this invention that the dopant concentration in the enhancement layer should significantly exceed the dopant levels in the active layer (e.g. 2× or higher).

Furthermore, in the present invention, it is advantageous that the adjacent or 'ionic' layer include relatively mobile ions (i.e. mobile cations for an adjacent layer which is in contact with a cathode enhancing layer), which would drift towards and into the enhancement layer under forwards bias (where forward bias mean a negative potential on the cathode electrode and electrons are injected from this cathode into the active layers of the device.

It is advantageous for a cathode (anode) enhancing layer to have a higher electron (hole) mobility as this promotes transport of electrons (holes) into the device and away from the near cathode (anode) region. This can reduce space charge injection limitations leading to lower operating voltage and/or better electron/hole balance. Also, a higher mobility transport medium for charge injected at an electrode tends to move the recombination zone, where that charge meets its opposite charge, further away from the electrode surface. Increasing distance from the electrodes is known to increase luminescence efficiency due to conductor and impurity related quenching effects: proximity to conductors can reduce radiative recombination while extrinsic impurities, which can also degrade luminescence efficiency can be highest near electrode interfaces due to process-related issues. These issues can include impurities coming from a printed electrode or from environmental exposure between transport layer and subsequent electrode layer depositions.

It is also of interest to modulate the election affinity and/or ionization potentials (LUMO or HOMO levels respectively) within the multilayer to block the transport of carrier such that recombination tends to be confined at an internal interface in the device. For example, an anode adjacent layer may have a lower ionization potential as compared to an overlying cathode adjacent layer such that holes transport to this interface but tend to be blocked by the energy step into the cathode adjacent material. This promotes recombination of holes with electrons near or in the anode-adjacent layer and away from the cathode interface. This is generally useful to avoid metal-proximity quenching or quenching or degradation from excited state interaction with impurities that are highest near an electrode interface, particularly a printed one. By blocking leakage currents this can also improve external quantum efficiency.

Furthermore, it can be advantageous to have organic semiconductors or polymers with relatively deep in the gap HOMO levels (i.e. high ionization potential) for layers adjacent or near the cathode and LUMO levels near the anode which are relatively high in the gap (i.e. have low electron affinity). These conditions can block leakage currents of holes into the cathode or electrons into the anode, which can reduce quantum efficiency.

It can also be advantageous to modulate the ionic supporting additives (such as ethylene oxides or other electrolyte components) or ion supporting side groups of the active layer materials through the thickness in the device. In one embodiment, there can be a layer in which the charge injection and/or transport is inherently high, even without the effect of added ions, such as for the anode side of a device based on soluble PPVs such as Merck SY. In this case, it can be advantageous for this layer to have a reduced ionic support content as higher ionic support content tend to reduce luminescent efficiency and electronic (hole) charge transport by diluting the semiconductor content and network. An overlying layer (assuming a bottom anode device such as ITO/PPV or ITO/PEDOT/PPV) which is cathode adjacent may have a higher ionic transport supporter content to facilitate cation transport to the critical cathode interface, where electron injection is sometimes the a critical device efficiency limitation. This can optimize device turn on transients along with recombination efficiency.

It may also be advantageous to have a multilayer structure such that highly ionically doped but very low (<10% by weight to 0%) ionic transport supporting content layers are very near the electrode interface(s). These layers should be thin enough such that counter ion transport out of these layers is still rapid (<50 nm more preferably <25 nm where an ionic mobility of >2e-11 cm2/V-s would be advantageous to create ~1 second turn on kinetics at reasonable voltages. Rapid counter ion transport leaves the adjacent electrode associated ion (e.g. cations near the cathode) in this highly doped electrode adjacent layer to assist charge injection. Furthermore, the low ionic transport content, and therefore higher semiconductor content, of this layer promotes better charge injection by presenting a higher fraction of semiconductor to inject electronic charge into from the electrode.

The following Table 2 lists calculations relating the ionic mobility requirements in an LEC in order to meet different turn-on criteria for different film thicknesses and operating voltages. Simple geometries and electric field assumptions are made, as the calculations serve non-limiting illustrative purposes. Assumptions are: ion drift mobility is field independent, no thermal/self-heating considerations, E-field is bias dropped across entire indicated thickness. Units are: velocity [cm/sec], E field [V/cm], mobility [cm$^2$/V-s].

TABLE 2

Ionic Mobility Calculations

| Effective active layer thickness over which ion transport must take place nm | | E field at 24 V | E field at 10 V | Mobility at 24 V | Mobility at 10 V |
|---|---|---|---|---|---|
| | Ionic velocity for 24 hr on time duty cycle [cm/s] | | | | |
| 100 | 1.15741E−10 | 2.40E+06 | 1.00E+06 | 4.82E−17 | 1.16E−16 |
| 500 | 5.78704E−10 | 4.80E+05 | 2.00E+05 | 1.21E−15 | 2.89E−15 |
| | Ionic velocity for 1 hr on time duty cycle [cm/s] | | | | |
| 100 | 2.77778E−09 | 2.40E+06 | 1.00E+06 | 1.16E−15 | 2.78E−15 |
| 500 | 1.38889E−08 | 4.80E+05 | 2.00E+05 | 2.89E−14 | 6.94E−14 |
| | Ionic velocity for 60 sec on time duty cycle [cm/s] | | | | |
| 100 | 1.66667E−07 | 2.40E+06 | 1.00E+06 | 6.94E−14 | 1.67E−13 |
| 500 | 8.33333E−07 | 4.80E+05 | 2.00E+05 | 1.74E−12 | 4.17E−12 |
| | Ionic velocity for 1 sec on time duty cycle [cm/s] | | | | |
| 100 | 0.00001 | 2.40E+06 | 1.00E+06 | 4.17E−12 | 1.00E−11 |
| 500 | 0.00005 | 4.80E+05 | 2.00E+05 | 1.04E−10 | 2.50E−10 |

While certain representative embodiments and details have been shown for purposes of illustrating the invention, it will be apparent to those skilled in the art that various changes in the methods and apparatus disclosed herein may be made without departing from the scope of the invention which is defined in the appended claims. Additionally, the commercial names of materials mentioned in the description are used to facilitate the reader's understanding, without any suggestion that the invention is restricted to only certain device configurations and materials mentioned herein.

What is claimed is:

1. An electronic device including a light-emitting layer in between a first electrode and a second electrode, wherein a higher concentration of neutral ionic dopant pairs is present in a region of the light-emitting layer adjacent to the first electrode as compared to the rest of the light-emitting layer.

2. The device in claim 1, wherein the region within the light-emitting layer adjacent to the first electrode has at least one ion with an ion mobility of more than 5e-17 cm2/Vs.

3. The device of claim 2, wherein the region within the light-emitting layer adjacent to the first electrode has substantially the same mobility for all ions.

4. The device of claim 1, wherein the region within the light-emitting layer adjacent to the first electrode has at least one ion with and ion mobility of more than 1e-15 cm2/Vs.

5. The device of claim 4, wherein the region within the light-emitting layer adjacent to the first electrode has substantially the same mobility for all ions.

6. The device of claim 1 wherein the region within the light-emitting layer adjacent to the first electrode has substantially the same mobility for all ions.

7. The device of claim 1, wherein the region within the light-emitting layer adjacent to the first electrode has cations and anions with different ionic conductivities.

8. The device of claim 1, wherein the region within the light-emitting layer adjacent to the first electrode has one ion charge type with ionic mobility of less than 1e-15 cm2/Vs and a counter ion with a different charge type has an ionic mobility of 1e-15 cm2/Vs.

9. An electronic device with a printed electrode and an active layer, wherein a paste to print the electrode has finite solubility of injection enhancing dopants, and, wherein, a higher concentration of dopants is present in an electrode interface region of the active layer of the device which is to be adjacent to the electrode, such that loss of dopant into the electrode paste during electrode fabrication is compensated.

10. The electronic device of claim 9, wherein the concentration of dopants in the electrode interface region is at least twice that of an internal region in the active layer.

11. The electronic device of claim 9, wherein a higher concentration of electrolyte forming material is present in the electrode interface region as compared to an internal region in the active layer.

12. The electronic device of claim 11, wherein the electrolyte forming material contains ethylene oxide.

13. The electronic device of claim 11, wherein the electrolyte forming material contains propylene oxide.

14. The electronic device of claim 9, wherein a higher concentration of ionic supporting sidechains is present in the electrode interface region of the active layer as compared to an internal region in the active layer.

15. The electronic device of claim 14, wherein the ionic supporting sidechains include oxygen in alkoxy or ethoxy form.

16. An electronic device with a printed electrode and a semiconductor active layer, wherein a film to print the electrode has finite solubility of injection enhancing dopants, and, wherein, a higher concentration of dopants is present in an electrode interface region of the semiconductor active layer of the device which is to be adjacent to the electrode, such that loss of dopant into the electrode film during electrode fabrication is compensated.

17. The device of claim 16, in which a higher concentration of neutral ionic dopant pairs is present in the electrode interface region as compared to an internal region of the semiconductor active layer, and an electron affinity of the semiconductor active layer is higher near an electron injecting electrode and/or an ionization potential is lower near a hole injecting electrode.

18. The device of claim 16, in which a higher concentration of neutral ionic dopant pairs is present in the electrode interface region as compared to an internal region of the semiconductor active layer, and an ionization potential of the semiconductor active layer is higher near an electron injecting electrode and/or an electron affinity is lower near a hole injecting electrode.

19. The device of claim 16, wherein the more heavily doped layer is near the cathode and the cation of the initially neutral pair is less mobile than the anion.

20. The device of claim 16, wherein the more heavily doped layer is near the anode and the anion of the initially neutral pair is less mobile than the cation.

* * * * *